US009929373B2

(12) United States Patent
Kamiya

(10) Patent No.: US 9,929,373 B2
(45) Date of Patent: Mar. 27, 2018

(54) DISPLAY DEVICE

(71) Applicant: Japan Display Inc., Minato-ku (JP)

(72) Inventor: Akinori Kamiya, Minato-ku (JP)

(73) Assignee: Japan Display Inc., Minato-ku (JP)

(*) Notice: Subject to any disclaimer, the term of this patent is extended or adjusted under 35 U.S.C. 154(b) by 0 days.

(21) Appl. No.: 15/360,281

(22) Filed: Nov. 23, 2016

(65) Prior Publication Data

US 2017/0250368 A1  Aug. 31, 2017

(30) Foreign Application Priority Data

Feb. 25, 2016  (JP) .................. 2016-034589

(51) Int. Cl.
| H01L 29/08 | (2006.01) |
| H01L 35/24 | (2006.01) |
| H01L 51/00 | (2006.01) |
| H01L 51/52 | (2006.01) |
| H01L 27/32 | (2006.01) |

(52) U.S. Cl.
CPC ...... H01L 51/5246 (2013.01); H01L 27/3211 (2013.01); H01L 27/3232 (2013.01); H01L 51/5281 (2013.01); *H01L 27/3244* (2013.01); *H01L 2251/5338* (2013.01)

(58) Field of Classification Search
None
See application file for complete search history.

(56) References Cited

U.S. PATENT DOCUMENTS

| 8,772,824 | B2* | 7/2014 | Lee | H01L 27/00 257/100 |
| 8,946,691 | B2* | 2/2015 | Lee | H01L 51/5088 257/100 |
| 9,035,291 | B2* | 5/2015 | Kim | H01L 51/5256 257/40 |
| 9,040,978 | B2* | 5/2015 | Sato | H01L 27/3244 257/40 |
| 9,065,072 | B2* | 6/2015 | Song | H01L 51/5253 |
| 9,082,668 | B2* | 7/2015 | Kim | H01L 27/124 |
| 9,224,981 | B2* | 12/2015 | Kang | H01L 51/5253 |
| 9,263,703 | B2* | 2/2016 | Kim | H01L 51/5281 |
| 9,293,515 | B2* | 3/2016 | Choi | H01L 27/3267 |
| 9,356,257 | B2* | 5/2016 | Kim | H01L 51/56 |
| 9,419,247 | B2* | 8/2016 | Kim | H01L 51/5256 |
| 9,444,076 | B2* | 9/2016 | No | H01L 51/5293 |
| 9,520,577 | B2* | 12/2016 | Sato | H01L 27/3244 |

(Continued)

FOREIGN PATENT DOCUMENTS

| JP | 9-244061 | 9/1997 |
| JP | 2000-113988 | 4/2000 |

(Continued)

*Primary Examiner* — Telly Green
(74) *Attorney, Agent, or Firm* — Oblon, McClelland, Maier & Neustadt, L.L.P.

(57) ABSTRACT

A display device includes: a light emitting element including a light emitting layer and an anode and a cathode that hold the light emitting layer therebetween; and a sealing layer that seals the light emitting element. The sealing layer includes an organic layer and a first inorganic layer and a second inorganic layer that hold the organic layer from an upper side and a lower side. The organic layer is a cholesteric liquid crystal layer with a circularly polarizing function.

5 Claims, 3 Drawing Sheets

(56) References Cited

U.S. PATENT DOCUMENTS

| | | | |
|---|---|---|---|
| 9,614,021 B2* | 4/2017 | Kim | H01L 51/5237 |
| 9,614,180 B2* | 4/2017 | Kang | H01L 51/5253 |
| 9,711,756 B2* | 7/2017 | Lee | H01L 51/5088 |
| 2014/0014909 A1* | 1/2014 | Lee | H01L 51/5088 257/40 |
| 2014/0048780 A1* | 2/2014 | Song | H01L 51/5253 257/40 |
| 2014/0217371 A1* | 8/2014 | Kim | H01L 27/3246 257/40 |
| 2015/0014636 A1* | 1/2015 | Kang | H01L 51/5253 257/40 |
| 2015/0028303 A1* | 1/2015 | Kim | H01L 51/5237 257/40 |
| 2015/0041813 A1* | 2/2015 | Kim | H01L 27/124 257/59 |
| 2015/0053957 A1* | 2/2015 | Sato | H01L 27/3244 257/40 |
| 2015/0076456 A1* | 3/2015 | Choi | H01L 27/3267 257/40 |
| 2015/0108455 A1* | 4/2015 | Jung | H01L 27/3246 257/40 |
| 2015/0123085 A1* | 5/2015 | Kim | H01L 51/5284 257/40 |
| 2015/0144933 A1* | 5/2015 | Lee | H01L 51/5088 257/40 |
| 2015/0228924 A1* | 8/2015 | Sato | H01L 27/3244 257/40 |
| 2015/0228928 A1* | 8/2015 | Kim | H01L 27/3246 257/40 |
| 2016/0037607 A1* | 2/2016 | Kim | H05B 33/20 313/512 |
| 2016/0093833 A1* | 3/2016 | No | H01L 51/5293 257/40 |
| 2016/0118628 A1* | 4/2016 | Kang | H01L 51/5275 257/40 |
| 2016/0307968 A1* | 10/2016 | Yoon | H01L 27/323 |
| 2017/0069808 A1* | 3/2017 | Kim | H01L 33/60 |
| 2017/0097710 A1* | 4/2017 | Bok | G06F 3/0412 |
| 2017/0110661 A1* | 4/2017 | Lee | B05B 15/0437 |
| 2017/0141313 A1* | 5/2017 | Min | C23C 14/042 |
| 2017/0154927 A1* | 6/2017 | Jo | H01L 27/288 |
| 2017/0154930 A1* | 6/2017 | Kim | G02B 5/0294 |
| 2017/0155093 A1* | 6/2017 | Jo | G06F 1/163 |

FOREIGN PATENT DOCUMENTS

| | | | | |
|---|---|---|---|---|
| JP | 2001-244080 | | 9/2001 | |
| JP | 2003-163087 | | 6/2003 | |
| JP | 2004-109582 | * | 4/2004 | ............ G02F 1/17 |
| JP | 2005-135812 | | 5/2005 | |
| JP | 2005-174605 | | 6/2005 | |
| JP | 2010-80880 | | 4/2010 | |

* cited by examiner

DISPLAY DEVICE

CROSS-REFERENCE TO RELATED APPLICATION

The present application claims priority from Japanese application JP2016-034589 filed on Feb. 25, 2016, the content of which is hereby incorporated by reference into this application.

BACKGROUND OF THE INVENTION

1. Field of the Invention

The present invention relates to a display device.

2. Description of the Related Art

Since a light emitting element layer such as an organic electroluminescence layer degenerates by absorbing moisture, it is covered by a sealing film to shut it off from atmosphere. For example, a sealing film of a multilayer structure where an organic layer made of resin is sandwiched by inorganic layers and a pinhole of the inorganic layers is buried is known. A polarizing plate is attached to the sealing film to prevent exterior light reflection.

JP2010-080880A discloses using a light emitting polymer having an orientation for a polarized light emission. JP2000-113988A discloses reducing reflected light by providing a liquid crystal element and a retardation plate on an organic electroluminescence element. JPH09-244061A discloses forming a liquid crystal display element on an organic electroluminescence element, and the liquid crystal display element is configured to be driven for displaying an image. JP2005-174605A discloses emitting polarized light by a liquid crystal light emitting layer. JP2005-135812A discloses laminating a λ/4 plate, a polarizing plate, TN (Twisted Nematic) type liquid crystal, and a red colored polarizing plate on an organic electroluminescence element. A change of displayed color is performed by switching the liquid crystal ON/OFF, and reflection is prevented by the λ/4 plate and the polarizing plate. JP2003-163087A discloses forming a light emitting layer in a twisted structure for a circular polarization and providing a circularly polarizing plate on the external side to prevent external light reflection. JP2001-244080A discloses forming a film of cholesteric liquid crystal on an organic electroluminescence element to prevent reflection and forming an alignment film on liquid crystal for an orientation of the liquid crystal.

As a display of the next generation, a flexible display that can be flexibly deformed has been drawing attention. However, a flexible display has a problem that it gets thicker and heavier when a polarizing plate is attached thereto, and thus becomes hard to be bent.

SUMMARY OF THE INVENTION

It is an object of the present invention to prevent external light reflection while maintaining reduction of thickness and weight and maintaining flexibility.

A display device according to the present invention includes: a light emitting element including a light emitting layer and an anode and a cathode that hold the light emitting layer therebetween; and a sealing layer that seals the light emitting element, wherein the sealing layer includes an organic layer and a first inorganic layer and a second inorganic layer that hold the organic layer from an upper side and a lower side, and the organic layer is a cholesteric liquid crystal layer with a circularly polarizing function. According to the present invention, since the organic layer held between the first inorganic layer and the second inorganic layer has the circularly polarizing function, external light reflection can be prevented with no necessity to provide a polarizing plate separately while maintaining reduction of thickness and weight and maintaining flexibility.

DETAILED DESCRIPTION OF THE INVENTION

Figure 1:
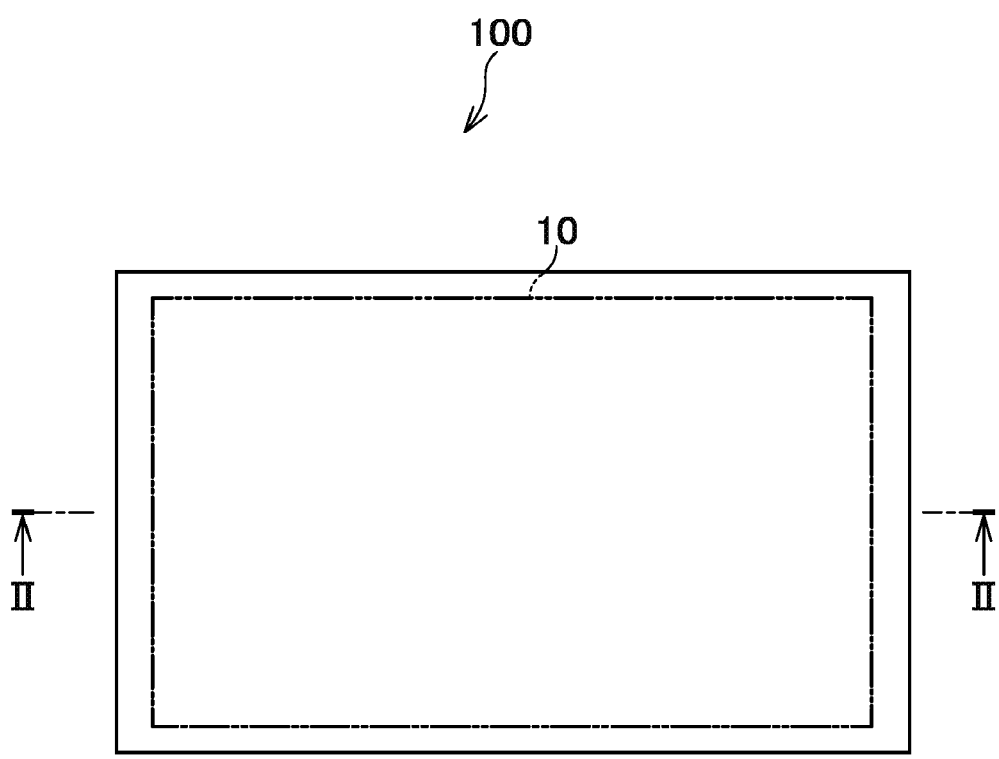
FIG. 1 is a planar view of a display device according to an embodiment of the present invention.

Below, embodiments of the present invention is illustrated with reference to the accompanying drawings. The present invention can be used in various modes without departing from the spirit thereof, and the interpretation should not be limited to the description of the exemplary embodiments illustrated below.

While the width, thickness, shape, and the like of each component in the drawings may be illustrated schematically as compared with the actual embodiments in order to clarify the explanation, these are merely examples and the interpretation of the present invention should not be limited thereto. Furthermore, in the specification or respective drawings, the same reference symbols may be applied to elements that have functions similar to those that have already been illustrated in another drawing and an explanation of such elements may be omitted as appropriate.

Further, in the detailed explanation of the invention, when a positional relationship between one component and another component is defined, unless specified otherwise, the words "on" and "under" are not applied only to a case where the other component is directly on or directly under the one component, but may also be applied to a case where still another component is interposed between the one component and the other component.

FIG. 1 is a planer view of a display device according to an embodiment of the present invention. As a display device 100, an organic electroluminescence display device is mentioned as an example. The display device 100 is configured to combine unit pixels of a plurality of colors composed of, for example, red, green and blue (subpixels) to form a pixel of full color (a pixel) and display an image of full color in a display region 10.

Figure 2:
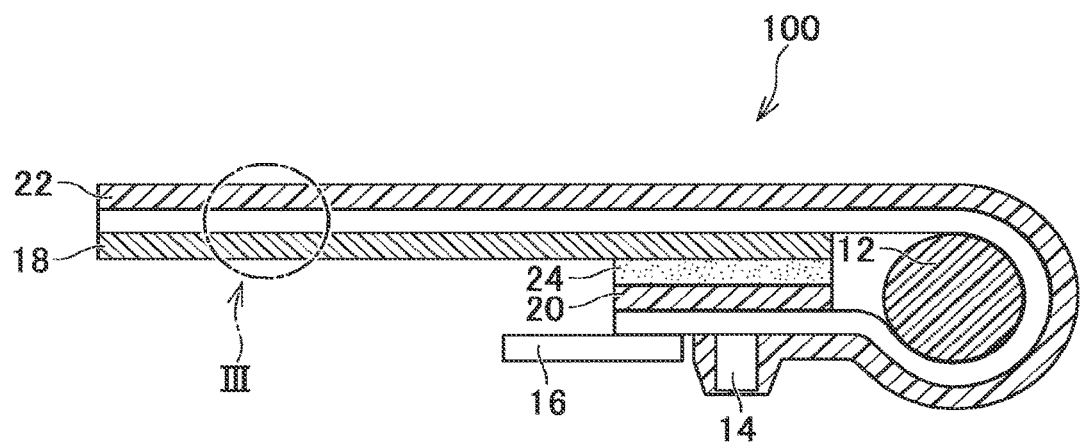
FIG. 2 is a cross sectional view of the display device illustrated in FIG. 1 at II-II line.

FIG. 2 is a cross sectional view of the display device 100 illustrated in FIG. 1 at II-II line. The display device 100 has a curved shape, and a spacer 12 is arranged inside the curvature. The spacer 12 works as a guide that restricts the curvature of the display device 100. An integrated circuit chip 14 is provided on the display device 100, and a flexible substrate 16 is connected to the display device 100.

Figure 3:
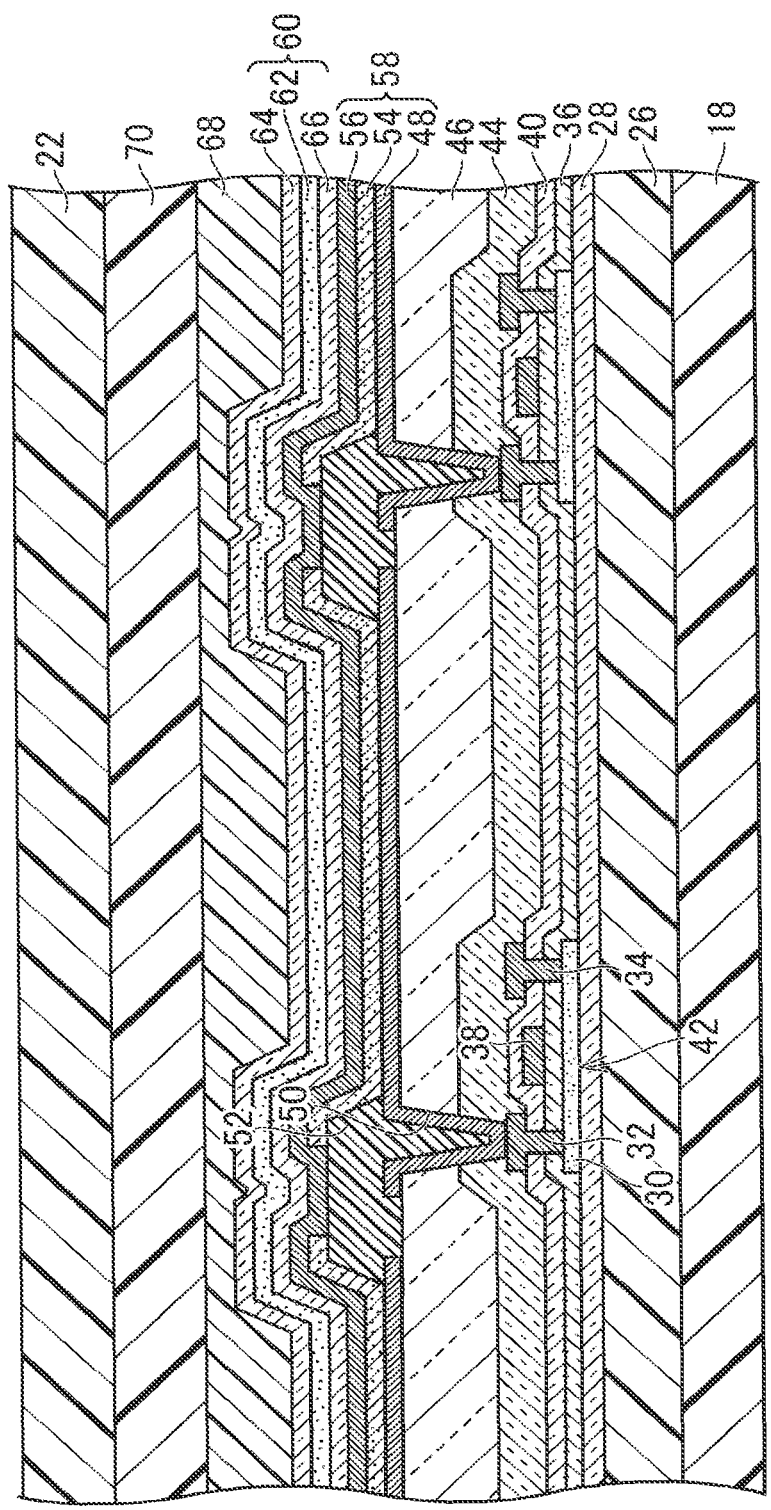
FIG. 3 is a magnified view of part III encircled by a chain line in FIG. 2.

FIG. 3 is a magnified view of part III encircled by a chain line in FIG. 2. The display device has a first substrate 26 made of a material having a flexibility such as resin. The first substrate 26 is located inside the curvature illustrated in FIG. 2. Inside the curvature, at least on the backside of the display region 10 of the display device 100, a first reinforcing film 18 is attached to the first substrate 26. Further, as illustrated in FIG. 2, a second reinforcing film 20 is attached so as to be opposed to the first reinforcing film 18, and the first reinforcing film 18 and the second reinforcing film 20 are attached to each other via an adhesive 24 to thereby maintain the curved state of the display device 100.

As illustrated in FIG. 3, on the first substrate 26, an undercoat 28 is formed that becomes a barrier against impurities that are contained by the first substrate 26 itself, and a semiconductor layer 30 is formed thereon. A source electrode 32 and a drain electrode 34 are connected electrically to the semiconductor layer 30, and a gate insulation film 36 is formed so as to cover the semiconductor layer 30. A gate electrode 38 is formed on the gate insulation film 36, and an interlayer insulation film 40 is formed so as to cover the gate electrode 38. The source electrode 32 and the drain electrode 34 penetrate the gate insulation film 36 and the interlayer insulation film 40. A thin film transistor 42 is constituted by the semiconductor layer 30, the source electrode 32, the drain electrode 34 and the gate electrode 38. A passivation film 44 is provided so as to cover the thin film transistor 42.

A planarization layer 46 is provided on the passivation film 44. A plurality of pixel electrodes 48 (e.g. anodes) arranged to correspond to each of the plurality of unit pixels are provided on the planarization layer 46. The planarization layer 46 is formed so that at least a surface where the pixel electrode 48 is provided is planarized. The pixel electrode 48 is electrically connected to one of the source electrode 32 and the drain electrode 34 on the semiconductor layer 30 through a contact hole 50 that penetrates the planarization layer 46 and the passivation film 44.

An insulation layer 52 is formed on the planarization layer 46 and the pixel electrode 48. The insulation layer 52 is put on a peripheral part of the pixel electrode 48, and is configured to form an opening at a part (e.g. a central part) of the pixel electrode 48. A bank to surround the part of the pixel electrode 48 is formed by the insulation layer 52.

A light emitting layer 54 is provided on the pixel electrode layer 48. The light emitting layer 54 is provided individually (separately) for each pixel electrode 48, and is configured to be put also on the insulation layer 52. In this case, the light emitting layer 54 emit light in blue, red and green in correspondence with respective pixels. As a variation, the light emitting 54 layer may be configured to be put on the plurality of pixel electrodes 48 continuously and made to emit light in white, and in such a case a color filter is provided.

On the light emitting layer 54, a common electrode (e.g. a cathode) is provided. The common electrode is formed to be put on the insulation layer 52 that constitutes the bank. A light emitting element 58 is constituted by the light emitting layer 54, and the pixel electrode 48 (the anode) and the common electrode (the cathode) that hold the light emitting layer 54 therebetween. The light emitting layer 54 is held between the pixel electrode 48 and the common electrode 56, and emits light with its luminance controlled by a current that runs therebetween. Between the light emitting layer 54 and the pixel electrode 48 (the anode), at least one of a hole injection layer and a hole transport layer (not shown) may be provided. Between the light emitting layer 54 and the common electrode 56 (the cathode), at least one of an electron injection layer and an electron transport layer (not shown) may be provided.

The light emitting element 58 is covered by a sealing layer 60 laminated on the common electrode 56 to be sealed and is shut off from moisture. The sealing layer 60 includes an organic layer 62, and a first inorganic layer 64 and a second inorganic layer 66 that hold the organic layer 62 from an upper side and a lower side. The organic layer 62 is a cholesteric liquid crystal layer that has a circularly polarizing function. The cholesteric liquid crystal layer can be formed by the inkjet method, the screen printing or the flexographic printing.

In this embodiment, the organic layer 62 held between the first inorganic layer 64 and the second inorganic layer 66 has a circularly polarizing function, and thus there is no necessity to provide a polarizing plate separately. Therefore, external light reflection can be prevented while maintaining reduction of thickness and weight and maintaining flexibility. A second substrate 70 made of a material having flexibility such as resin is attached to the sealing layer 60 via an adhesive layer 68. A third reinforcing film 22 is attached to the second substrate 70 at the front side of the curvature of the display device 100 (see FIG. 2).

The display device 100 is not limited to an organic electroluminescence display device, and may be a display device that is provided with a light emitting element such as a quantum-dot light emitting diode (QLED) for each pixel or may be a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, the display device having a curved shape and comprising:
    a spacer as a guide for restricting curvature of the display device;
    a first substrate located inside the curvature of the display device, the first substrate including a first portion and a second portion that are opposed to each other;
    a first reinforcing film attached to the first portion of the first substrate;
    a second reinforcing film attached to the second portion of the first substrate;
    an adhesive that attaches the first reinforcing film to the second reinforcing film;
    a light emitting element including a light emitting layer and an anode and a cathode that hold the light emitting layer therebetween; and
    a sealing layer that seals the light emitting element, wherein
    the sealing layer comprises an organic layer and a first inorganic layer and a second inorganic layer that hold the organic layer from an upper side and a lower side, and
    the organic layer is a cholesteric liquid crystal layer with a circularly polarizing function.

2. The display device according to claim 1, wherein external light reflection is prevented.

3. The display device according to claim 1, wherein the cholesteric liquid crystal layer is formed by an inkjet method, screen printing or flexographic printing.

4. The display device according to claim 1, which further comprises a second substrate attached to the sealing layer.

5. The display device according to claim 4, which further comprises a third reinforcing film attached to the second substrate.

* * * * *